United States Patent
Schauwecker et al.

(10) Patent No.: US 6,496,091 B2
(45) Date of Patent: Dec. 17, 2002

(54) DIMENSIONING OF A SUPERCONDUCTING SHIM DEVICE IN A SUPERCONDUCTING MAGNET ARRANGEMENT

(75) Inventors: Robert Schauwecker; Pierre-Alain Bovier; Andreas Amann, all of Zurich; Werner Tschopp, Forch, all of (CH)

(73) Assignee: Bruker AG, Fällanden (CH)

( * ) Notice: Subject to any disclaimer, the term of this patent is extended or adjusted under 35 U.S.C. 154(b) by 0 days.

(21) Appl. No.: 09/930,955

(22) Filed: Aug. 17, 2001

(65) Prior Publication Data

US 2002/0047763 A1 Apr. 25, 2002

(30) Foreign Application Priority Data

Aug. 24, 2000 (DE) .......................................... 100 41 683

(51) Int. Cl.[7] ................................................. H01F 6/00
(52) U.S. Cl. ...................... 335/216; 335/301; 324/319; 324/320
(58) Field of Search ................................. 335/216, 299, 335/301; 324/318, 319, 320

(56) References Cited

U.S. PATENT DOCUMENTS 5,329,266 A 7/1994 Soeldner

OTHER PUBLICATIONS

C. P. Bean "Magnetization of Hard Superconductors" Phys. Rev. Let 8, p 250 ff (1962).

C. P. Bean "Magnetization of High–Field Superconductors", Rev. Mod. Phys. 36, 31 (1964).

NMR Magnet System 600 MHz/54 mm company prospectus of BRUKER Magnetics, May 15, 1999.

*Primary Examiner*—Ramon M. Barrera
(74) *Attorney, Agent, or Firm*—Paul Vincent

(57) ABSTRACT

A superconducting magnet arrangement (M, S, P1, . . . , Pn) for generating a magnetic field in the direction of a z axis in a working volume, disposed about z=0, comprising a magnet coil system (M) with at least one current-carrying superconducting magnet coil, a shim device (S) with at least one superconducting shim coil and additional superconductingly closed current paths (P1, . . . , Pn), wherein the magnetic fields generated in the z direction and in the working volume by the additional current paths due to induced currents during operation, do not exceed a magnitude of 0.1 Tesla, and wherein the shim device generates a field which varies along the z axis with a $k^{th}$ power of z for an even power of k>0, is characterized in that the shim device is designed such that the effective field efficiency $g_S^{eff}$ of the shim device is substantially zero taking into consideration the diamagnetism of the superconductor in the magnet coil system.

19 Claims, 4 Drawing Sheets

DIMENSIONING OF A SUPERCONDUCTING SHIM DEVICE IN A SUPERCONDUCTING MAGNET ARRANGEMENT

This application claims Paris Convention priority of DE 100 41 683.7 filed Aug. 24, 2000 the complete disclosure of which is hereby incorporated by reference.

BACKGROUND OF THE INVENTION

The invention concerns a superconducting magnet arrangement for generating a magnetic field in the direction of a z axis in a working volume disposed about z=0, with a magnet coil system having at least one current-carrying superconducting magnet coil, a shim device with at least one superconducting shim coil and one or several additional superconductingly closed current paths, wherein the magnetic fields in the z direction produced by induced currents through the additional current paths during operation do not exceed a magnitude of 0.1 Tesla in the working volume, and wherein the shim device generates a field which varies along the z axis with the $k^{th}$ power of z for an even power of k>0.

A superconducting magnet arrangement with a $Z^2$ shim device of this type is part of e.g. the NMR Magnet System 600 SB UltraShield™ (company leaflet dated May 15, 1999) distributed by the company Bruker Magnetics.

U.S. Pat. No. 5,329,266 describes a superconducting magnet arrangement with an actively shielded magnet and additional superconducting current paths without a $Z^2$ shim device.

Superconducting magnets are used for different applications, in particular for magnetic resonance methods, in which the local homogeneity of the magnetic field is usually important. One of the most demanding applications is high-resolution nuclear magnetic resonance spectroscopy (NMR spectroscopy). The basic homogeneity of the superconducting magnet can be optimized through the geometrical arrangement of the field-generating magnet coils. In demanding applications, the basic homogeneity of the magnet is usually insufficient due to deviations from the design caused by production tolerances. To compensate for residual inhomogeneities of the magnet, the magnet system is equipped with autonomous superconducting coils which compensate for field inhomogeneities having a certain geometrical symmetry in the working volume, so-called shim devices. Examples of such shim devices are so-called $Z^n$ shims which produce a field which varies along the magnet axis z as $z^n$. The main focus of the invention is the dimensioning of superconducting $Z^n$ shims in magnet systems with active stray field shielding and additional superconducting current paths, e.g. to compensate for external field fluctuations.

The field contribution of a superconducting $Z^n$ shim in a working volume must be substantially zero in the working volume at z=0, irrespective of the current in the shim coils, thereby taking into consideration the field contributions of the shim coils themselves and also of the field change due to currents induced in the superconducting magnet and in further superconductingly closed current paths during charging of the shim device. Dimensioning of a $Z^n$ shim according to a conventional method will produce, in certain cases, an undesired shift of the magnetic field strength in the working volume at z=0 during charging of the shim device. In actively shielded magnets, this behavior is particularly clear with shim devices whose coils are distributed over different radii because the conventional methods for dimensioning superconducting shim devices treat the superconductor as a non-magnetic material. The present invention also takes into consideration that the superconductor substantially exhibits a diamagnetic material behavior in response to field fluctuations of less than 0.1 Tesla, which can e.g. occur in the magnet volume during charging of a superconducting shim device, and thereby largely expels small field fluctuations from its inner regions. This results in a redistribution of the magnetic flux of the field fluctuations in the magnet arrangement which, in turn, influences the reaction of the superconducting magnet and further superconductingly closed current paths to a current change in the shim device, since this reaction is determined by the principle of magnetic flux conservation through a closed superconducting loop.

In contrast thereto, it is the underlying purpose of the present invention to modify a superconducting $Z^n$ shim in a magnet arrangement of the above-mentioned type in as simple a manner as possible such that the shim device is correctly dimensioned while taking into consideration the diamagnetism of the superconductor such that, in particular, its field contribution in the working volume is substantially zero in the working volume at z=0, irrespective of the current in the shim coils.

SUMMARY OF THE INVENTION

This object is achieved in accordance with the invention by designing the shim device such that the variable $g_S^{\textit{eff}} = g_S - g^T \cdot (L^{cl} - \alpha L^{cor})^{-1} \cdot (L_{\leftarrow S}^{cl} - \alpha_{L_{\leftarrow S}}^{cor})$ is substantially zero if and only if the variable $g_S^{\textit{eff,cl}} = g_S - g^T \cdot (L^{cl})^{-1} \cdot L_{\leftarrow S}^{cl}$, which would have resulted were $\alpha=0$, is larger than zero, in particular larger than 0.2 millitesla per ampere.

The above variables have the following definitions:

$g_S^{\textit{eff}}$: Field contribution per ampere current of the shim device in the working volume at z=0 thereby taking into consideration the field contributions of the shim coils themselves and of the field change due to currents induced in the superconducting magnet coil system and in the further superconductingly short-circuited current paths during charging of the shim device, $-\alpha$: average magnetic susceptibility in the volume of the magnet coil system with respect to field fluctuations which do not exceed a magnitude of 0.1 T, wherein $0<\alpha\leq1$, $g^T = (g_M, g_{P1}, \ldots, g_{Pj}, \ldots, g_{Pn})$, $g_{Pj}$: Field per ampere of a current path $P_j$ in the working volume without the field contributions of current paths $P_i$ for $i\neq j$ and of the magnet coil system and without the field contributions of the shim device, $g_M$: Field per ampere of the magnet coil system in the working volume without the field contributions of the additional current paths and without the field contributions of the shim device, $g_S$: Field per ampere of the shim device in the working volume without the field contributions of the additional current paths and of the magnet coil system, $L^{cl}$: Matrix of inductive couplings between the magnet coil system and the additional current paths and among the additional current paths, $L^{cor}$: Correction for the inductance matrix $L^{cl}$, which would result with complete diamagnetic expulsion of disturbing fields from the volume of the magnet coil system, $L_{\leftarrow S}^{cl}$: Vector of the inductive couplings of the shim device with the magnet coil system and the additional current paths, $L_{\leftarrow S}^{cor}$: Correction for the coupling vector $L_{\leftarrow S}^{cl}$, which would result for complete diamagnetic expulsion of disturbance fields from the volume of the magnet coil system.

According to prior art, correct dimensioning of a $Z^n$ shim entails correct calculation of the field efficiencies $g_S$, $g_{p1}, \ldots, g_{Pn}$ and $g_M$ of the shim device, of the additional superconducting current paths and of the magnet (without taking into consideration the respective reactions of the other components) and the mutual inductive couplings among the shim device, the additional current paths and the magnet as well as all self-inductances, wherein the shim device is then designed such that the variable $g_S^{\it{eff,cl}} = g_S - g^T \cdot (L^{cl})^{-1} \cdot L_{\leftarrow S}^{cl}$ is substantially zero. When dimensioning the shim device of an arrangement in accordance with the invention, in addition to the above-mentioned coil properties, the magnetic shielding behavior of the superconducting volume portion of the magnet coil system is also taken into consideration. For this reason, the shim device is dimensioned such that instead of the variable $g_S^{\it{eff,cl}}$ the variable $g_S^{\it{eff}} = g_S - g^T \cdot (L^{cl} - \alpha L^{co})^{-1} \cdot (L_{\leftarrow S}^{cl} - \alpha L_{\leftarrow S}^{cor})$ is substantially zero. The above-mentioned magnetic shielding behavior of the superconductor is present in all superconducting magnet arrangements, but only has significant effect on the variable $g_S^{\it{eff}}$ in certain cases. The present invention is advantageous in that such magnet arrangements also satisfy the requirement for the shim device that $g_S^{\it{eff}}$ be substantially zero.

The above-mentioned advantages of the invention are significant mainly in systems where the local homogeneity of the magnetic field in the working volume is particularly important. In one preferred embodiment, the inventive magnet arrangement is therefore part of an apparatus for high-resolution magnetic resonance spectroscopy, e.g. in the field of NMR, ICR or MRI.

In an advantageous further development of this embodiment, the magnetic resonance apparatus comprises a means for field locking the magnetic field generated in the working volume.

In an improved further development, the magnet arrangement can also comprise field modulation coils.

One embodiment of the inventive magnet arrangement is particularly preferred, wherein the superconducting magnet coil system comprises a radially inner and a radially outer coaxial coil system which are electrically connected in series, wherein these two coil systems each generate one magnetic field of mutually opposite direction along the z axis in the working volume. In such an arrangement, the diamagnetic shielding behavior of the superconductor typically has a particularly strong effect on the effective field strength in the working volume $g_S^{\it{eff}}$ of certain shim devices in the magnet coil system.

In a further development of this embodiment, the radially inner coil system and the radially outer coil system have dipole moments approximately equal in value and opposite in sign. This is the condition for optimum suppression of the stray field of the magnet coil system. Due to the great technical importance of actively shielded magnets, the correct dimensioning of shim devices in magnets, wherein the above-mentioned magnetic shielding behavior of the superconductor in the magnet coil system has significant influence on the effective field strength in the working volume $g_S^{\it{eff}}$ of the shim device, is particularly advantageous.

In another advantageous further development of one of the above embodiments, the magnet coil system forms a first current path which is superconductingly short-circuited during operation, and a disturbance compensation coil which is not galvanically connected to the magnet coil system is disposed coaxially to the magnet coil system and forms a further current path which is superconductingly short-circuited during operation. The presence of a disturbance compensation coil improves the temporal stability of the magnetic field in the working volume under the influence of external field fluctuations. Such a further development of an inventive magnet arrangement takes into consideration the influence of a disturbance compensation coil on the effective field strength in the working volume $g_S^{\it{eff}}$ of the shim device.

In one further advantageous development, at least one of the additional current paths consists of a part of the magnet coil system which is bridged with a superconducting switch. Such an arrangement improves the temporal stability of the magnetic field in the working volume under the influence of external field fluctuations. Such a further development of an inventive magnet arrangement takes into consideration the influence of bridging part of the magnet coil system with a superconducting switch on the effective field strength in the working volume $g_S^{\it{eff}}$ of the shim device.

In an advantageous further development of the inventive magnet arrangement, at least one of the additional current paths is part of a system for compensating the drift of the magnetic coil system. Such an arrangement improves the temporal stability of the magnetic field in the working volume. Such a further development of an inventive magnet arrangement takes into consideration the influence of drift compensation on the effective field strength in the working volume $g_S^{\it{eff}}$ of the shim device.

In one further advantageous development, at least one of the additional current paths consists of a further superconducting shim device. Such an arrangement compensates for field inhomogeneities which have different symmetries. Such a further development of an inventive magnet arrangement takes into consideration the influence of the additional superconducting shim devices on the effective field strength in the working volume $g_S^{\it{eff}}$ of the first shim device.

One particularly preferred embodiment of the inventive magnet arrangement is characterized in that the superconducting shim device produces a field in the working volume having a $z^2$ dependence along the z axis. Such shim devices are particularly important since superconducting magnet coil systems often have a field inhomogeneity which has a $z^2$ dependence along the z axis in the working volume.

In a particularly advantageous further development of this magnet arrangement, the superconducting shim device comprises partial coils which are wound at different radii to permit a more compact construction of the shim device. The magnetic shielding behavior of the superconductor in the magnet coil system of such an arrangement typically has a particularly strong effect on the effective field strength in the working volume $g_S^{\it{eff}}$ of the shim device.

Another advantageous further development of an inventive magnet arrangement is characterized in that the superconducting shim device is inductively decoupled from the superconducting magnet coil system to prevent high induced currents in the shim device during charging or during a quench of the superconducting magnet coil system.

An advantageous further development of this embodiment utilizes the different polarities of the radially inner and the radially outer coil system for inductive decoupling of the magnet coil system and shim device, wherein the superconducting magnet coil system has a radially inner and a radially outer coaxial coil system which are electrically connected in series, with these two coil systems each generating one magnetic field of mutually opposing directions along the z axis in the working volume. Utilization of the different polarities of the radially inner and radially outer coil system facilitates design of the magnet arrangement in accordance with the above-described embodiment.

The present invention also comprises a method for dimensioning a shim device which is characterized in that the variable $g_S^{eff}$, which corresponds to the field change in the working volume at z=0 per ampere current in the shim device, is calculated, taking into consideration the magnetic fields generated due to the currents induced in the residual magnet arrangement, according to:

$$g_S^{eff} = g_S - g^T \cdot (L^{cl} - \alpha L^{cor})^{-1} \cdot (L_{\leftarrow S}^{cl} - \alpha L_{\leftarrow S}^{cor}),$$

wherein these variables have the above-mentioned definitions. This method for dimensioning a shim device advantageously takes the magnetic shielding behavior of the superconductor in the magnet coil system into consideration. This method permits dimensioning of all embodiments of the invention through calculation of the behavior of the magnet system during charging of the shim device thereby taking into consideration the current changes induced in the magnet coil system and in the additional current paths. This method is based on the calculation of correction terms for the inductive couplings among the additional current paths, with the magnet coil system and with the shim device and for all self-inductances, which influence the corresponding quantities with a weighting factor $\alpha$. This method improves the correspondence between calculated and measurable field strength in the working volume $g_S^{eff}$ of the shim device compared to a conventional method. In particular, $g_S^{eff}$ can be made substantially zero.

In a simple variant of the inventive method, the parameter a corresponds to the volume portion of the superconductor material with respect to the coil volume of the magnet coil system. This method for determining the parameter $\alpha$ is based on the assumption that the superconductor has a susceptibility with respect to field fluctuations of $(-1)$ (ideal diamagnetism).

The values for $\alpha$ determined in this fashion cannot be experimentally confirmed for most magnet types. A particularly preferred alternative method variant is therefore characterized in that the parameter a for the magnet coil system is experimentally determined from the measurement of the variable $$\beta^{exp} = \frac{g_D^{exp}}{g_D}$$

of the magnet coil system, with no additional current paths present, in response to a disturbance coil generating a substantially homogeneous disturbance field in the volume of the magnet coil system, and through insertion of the variable $\beta^{exp}$ into the equation $$\alpha = \frac{g_D (L_M^{cl})^2 (\beta^{exp} - \beta^{cl})}{g_D (\beta^{exp} - \beta^{cl}) L_M^{cl} L_M^{cor} - g_M (L_{M \leftarrow D}^{cl} L_M^{cor} - L_{M \leftarrow D}^{cor} L_M^{cl})},$$

wherein $g_D^{exp}$: measured field change in the working volume of the magnet arrangement per ampere current in the disturbance coil, $$\beta^{cl} = 1 - g_M \cdot \left( \frac{L_{M \leftarrow D}^{cl}}{L_M^{cl} \cdot g_D} \right),$$

$g_M$: Field per ampere of the magnet coil system in the working volume, $g_D$: Field per ampere of the disturbance coil in the working volume without the field contributions of the magnet coil system, $L_M^{cl}$: Self inductance of the magnet coil system, $L_{M \leftarrow D}^{cl}$: Inductive coupling of the disturbance coil with the magnet coil system, $L_M^{cor}$: Correction for the self inductance $L_M^{cl}$ of the magnet coil system, which would result for complete diamagnetic expulsion of disturbance fields from the volume of the magnet coil system, $L_{M \leftarrow D}^{cor}$: Correction for the inductive coupling $L_{M \leftarrow D}^{cl}$ of the disturbance coil with the magnet coil system which would result for complete diamagnetic expulsion of disturbance fields from the volume of the magnet coil system.

Finally, in a further particularly preferred variant of the inventive method, the corrections $L^{cor}$, $L_{\leftarrow S}^{cor}$, $L_M^{cor}$ and $L_{M \leftarrow S}^{cor}$ are calculated as follows:

$$L^{cor} = \begin{pmatrix} L_M^{cor} & L_{M \leftarrow P1}^{cor} & \cdots & L_{M \leftarrow Pn}^{cor} \\ L_{P1 \leftarrow M}^{cor} & L_{P1}^{cor} & \cdots & L_{P1 \leftarrow Pn}^{cor} \\ \vdots & \vdots & \ddots & \vdots \\ L_{Pn \leftarrow M}^{cor} & L_{Pn \leftarrow P1}^{cor} & \cdots & L_{Pn}^{cor} \end{pmatrix},$$

$$L_{\leftarrow S}^{cor} = \begin{pmatrix} L_{M \leftarrow S}^{cor} \\ L_{P1 \leftarrow S}^{cor} \\ \vdots \\ L_{Pn \leftarrow S}^{cor} \end{pmatrix},$$

$L_{Pj \leftarrow Pk}^{cor} = f_{Pj}(L_{(Pj,red,Ra_1) \leftarrow Pk}^{cl} - L_{(Pj,red,Ri_1) \leftarrow Pk}^{cl}),$ $L_{Pj \leftarrow S}^{cor} = f_{Pj}(L_{(Pj,red,Ra_1) \leftarrow S}^{cl} - L_{(Pj,red,Ri_1) \leftarrow S}^{cl}),$ $L_{Pj \leftarrow M}^{cor} = f_{Pj}(L_{(Pj,red,Ra_1) \leftarrow M}^{cl} - L_{(Pj,red,Ri_1) \leftarrow M}^{cl}),$ $L_{M \leftarrow Pj}^{cor} = L_{1 \leftarrow Pj}^{cl} - L_{(1,red,Ri_1) \leftarrow Pj}^{cl} + \frac{Ra_1}{R_2}(L_{(2,red,Ra_1) \leftarrow Pj}^{cl} - L_{(2,red,Ri_1) \leftarrow Pj}^{cl}),$ $L_{M \leftarrow S}^{cor} = L_{1 \leftarrow S}^{cl} - L_{(1,red,Ri_1) \leftarrow S}^{cl} + \frac{Ra_1}{R_2}(L_{(2,red,Ra_1) \leftarrow S}^{cl} - L_{(2,red,Ri_1) \leftarrow S}^{cl}),$ $L_M^{cor} = L_{1 \leftarrow 1}^{cl} - L_{(1,red,Ri_1) \leftarrow 1}^{cl} + L_{1 \leftarrow 2}^{cl} - L_{(1,red,Ri_1) \leftarrow 2}^{cl} +$
$\frac{Ra_1}{R_2}(L_{(2,red,Ra_1) \leftarrow 2}^{cl} - L_{(2,red,Ri_1) \leftarrow 2}^{cl} + L_{(2,red,Ra_1) \leftarrow 1}^{cl} - L_{(2,red,Ri_1) \leftarrow 1}^{cl})$ wherein $Ra_1$: Outer radius of the magnet coil system (in case of an actively shielded magnet coil system, the outer radius of the main coil), $Ri_1$: Inner radius of the magnet coil system, $R_2$: in the case of an actively shielded magnet coil system, the average radius of the shielding, otherwise infinite, $R_{Pj}$: average radius of the additional coil Pj, $$f_{Pj} = \begin{cases} \frac{Ra_1}{R_{Pj}}, & R_{Pj} > Ra_1 \\ 1, & R_{Pj} < Ra_1 \end{cases}$$

and wherein the index 1 represents the main coil of an actively shielded magnet coil system, otherwise the magnet coil system, and the index 2 represents the shielding of an actively shielded magnet coil system, and otherwise terms of index 2 are omitted, and the index (X,red,R) designates a hypothetical coil having all windings of a coil X at the radius R.

The particular advantage of this method for calculating the corrections $L^{cor}$, $L_{\leftarrow S}^{cor}$, $L_M^{cor}$ and $L_{M \leftarrow S}^{cor}$ consists in that the corrections are derived from inductive couplings and self-inductances of coils thereby taking into consideration the geometric arrangement of the coils concerned.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail with respect to embodiments.

DESCRIPTION OF THE PREFERRED EMBODIMENT

Figure 1:
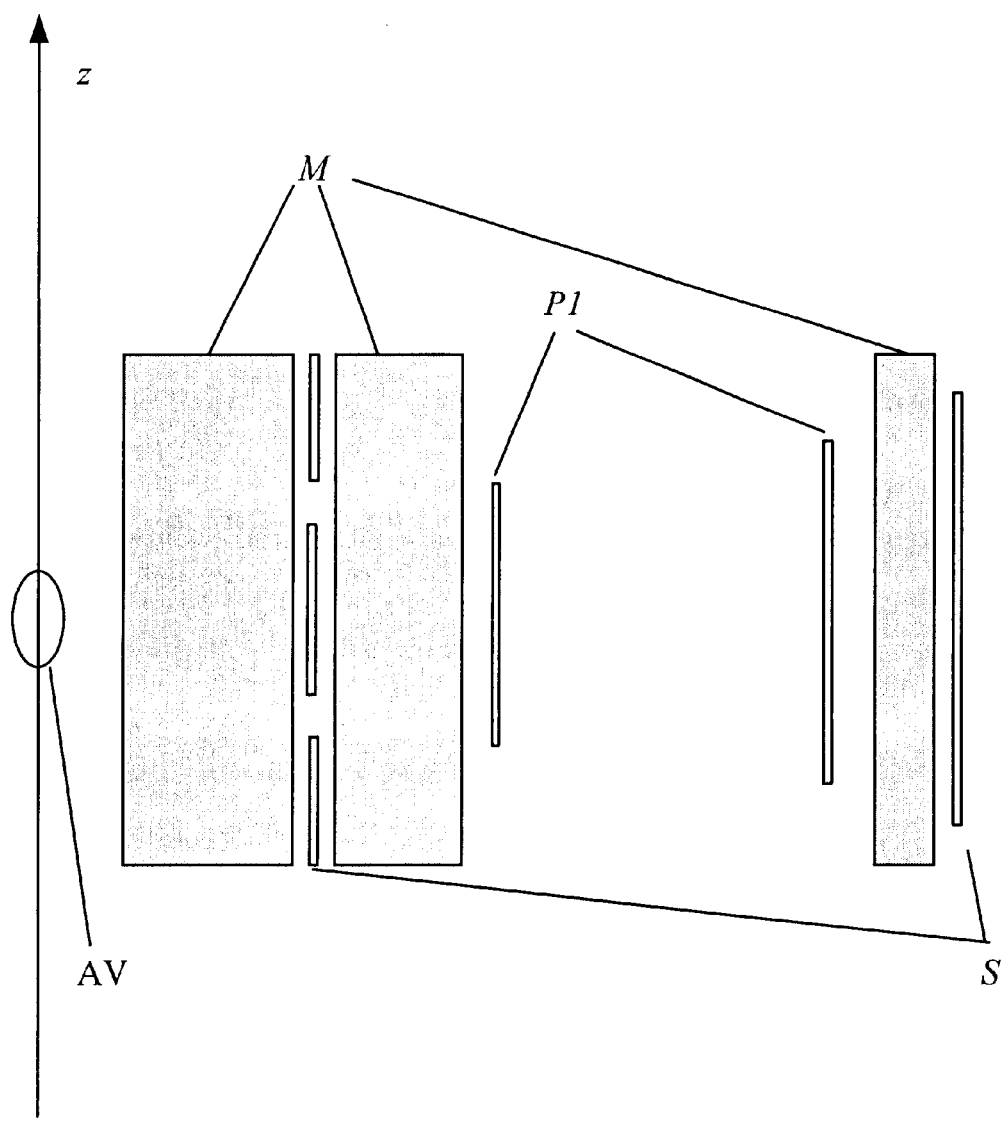
FIG. 1 shows a schematic vertical section through a radial half of the inventive magnet arrangement for generating a magnetic field in the direction of a z axis in a working volume AV disposed about z=0 with a magnet coil system M, a shim device S and an additional superconductingly closed current path P1.

As seen in FIG. 1, the superconducting magnet coil system M, the shim device S, and the additional current path P1 of an inventive magnet arrangement can each comprise several partial coils which may be located at different radii. The partial coils can have different polarities. All partial coils are disposed coaxially about a working volume AV on an axis z proximate z=0. The small coil cross-section of the shim device S and the additional coil P1 in FIG. 1 indicate that the shim device S and the additional coil P1 generate only weak magnetic fields and that the main field is produced by the magnet coil system M.

Figure 2:
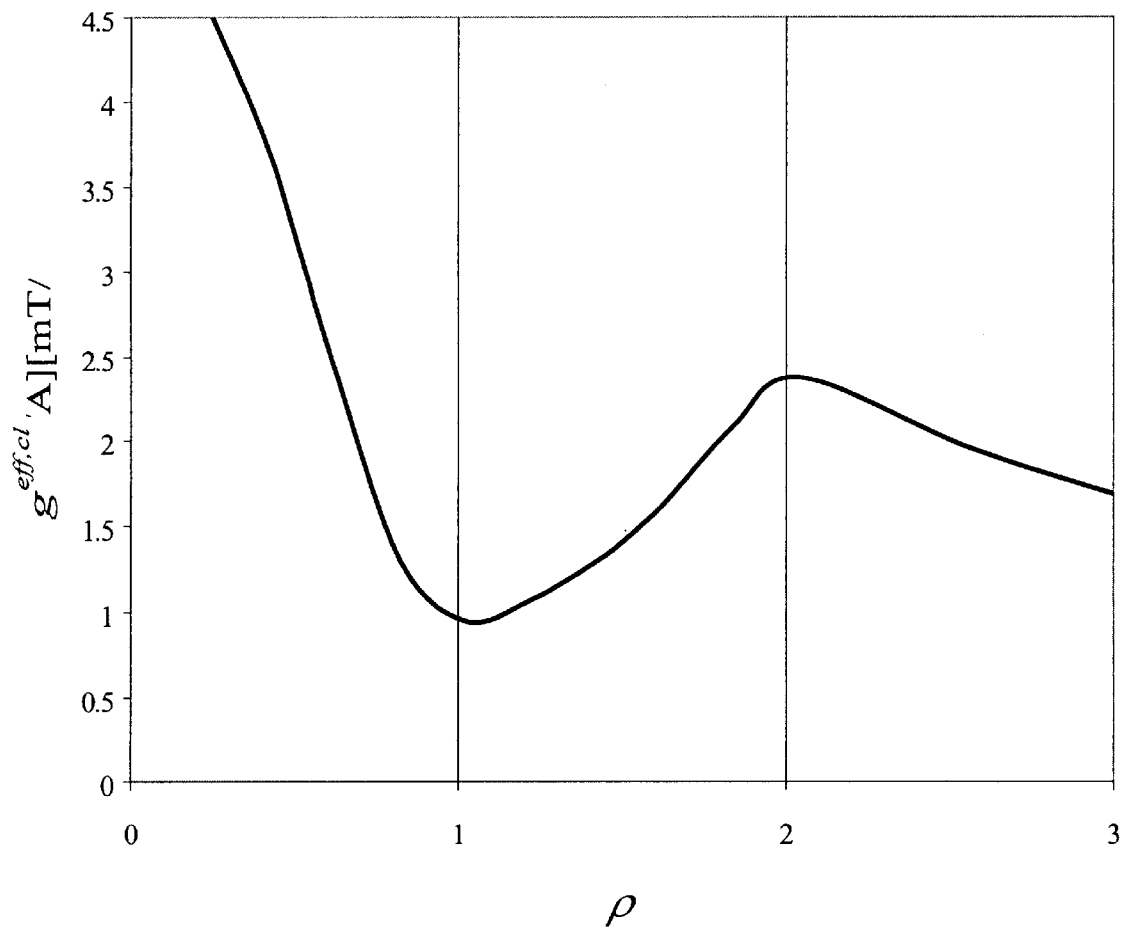
FIG. 2 shows the effective field strength $g^{\textit{eff},cl}$ per ampere current, calculated with a conventional method, for an individual partial coil of a shim device in an actively shielded superconducting magnet coil system without additional current paths as a function of the reduced radius ρ (radius normalized to the outer radius of the main coil of the magnet coil system) of that partial coil.
Figure 3:
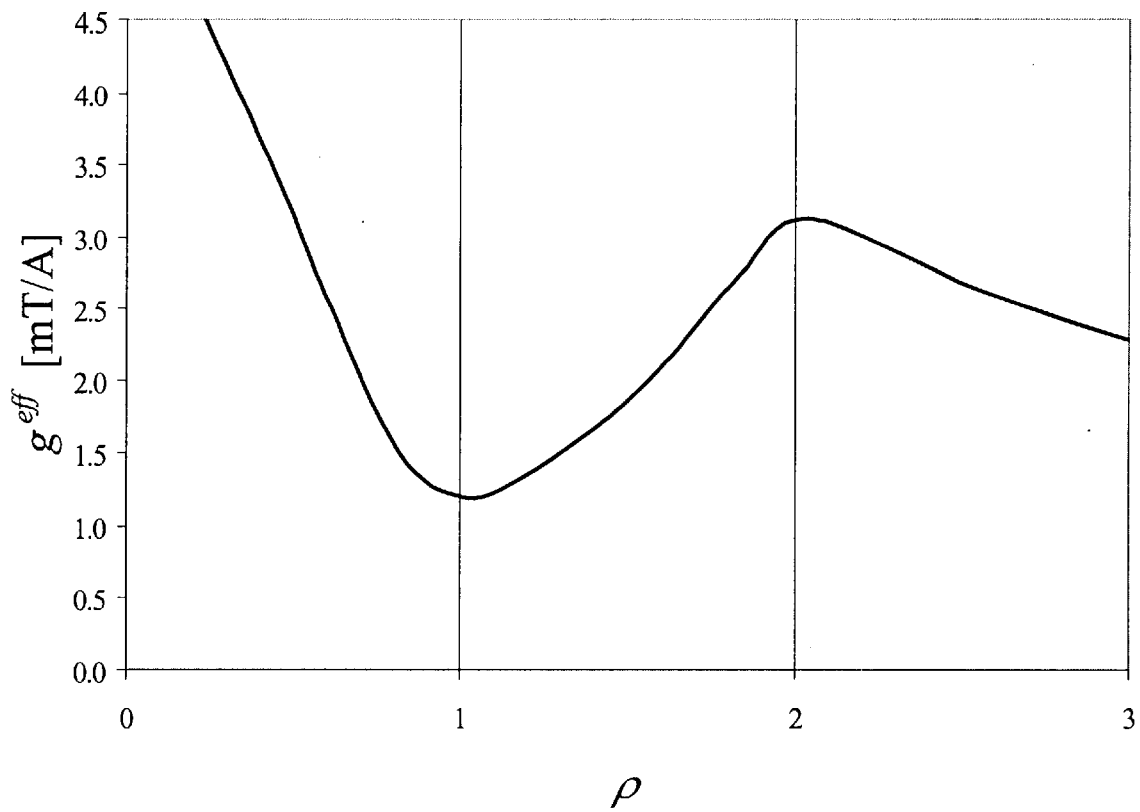
FIG. 3 shows the effective field strength $g^{\textit{eff}}$ per ampere current, calculated with the inventive method, for one individual partial coil of a shim device in an actively shielded superconducting magnet coil system without additional current paths as a function of the reduced radius ρ (radius normalized to the outer radius of the main coil of the magnet coil system) of that partial coil.
Figure 4:
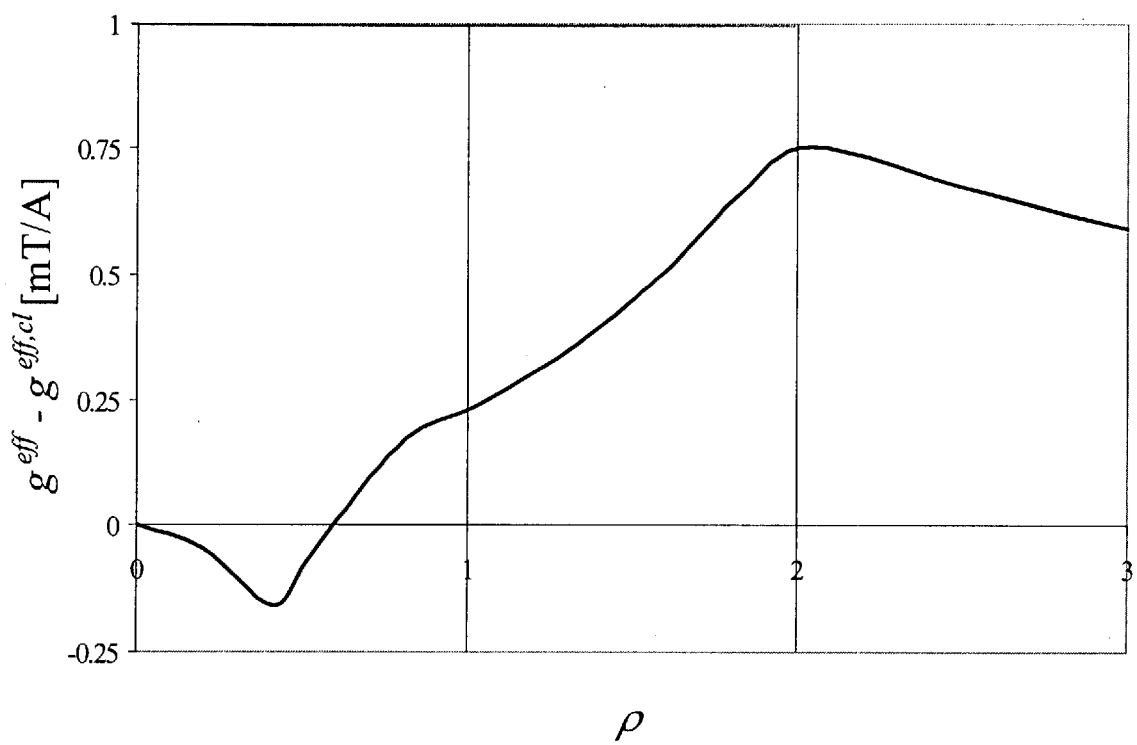
FIG. 4 shows the difference between the variables $g^{\textit{eff}}$ and $g^{\textit{eff},cl}$ of FIG. 2 and 3 as a function of the reduced radius ρ (radius normalized to the outer radius of the main coil) of that partial coil.

FIGS. 2 through 4 show the functions $g^{\textit{eff},cl}$ and $g^{\textit{eff}}$ for one individual partial coil of a shim device in dependence on the radius of the partial coil. The partial coil has an axial length of 200 mm and consists of two layers each having 400 wire windings. Its central plane is at the height of the working volume at z=0. The variables $g^{\textit{eff},cl}$ and $g^{\textit{eff}}$ correspond to the field contribution per ampere of the partial coil in the working volume at z=0 thereby taking into consideration the field contributions of the partial coil itself and the field change due to currents which are induced in the superconducting magnet system M during charging of the partial coil, wherein $g^{\textit{eff},cl}$ was calculated with a method according to prior art and $g^{\textit{eff}}$ was calculated with the inventive method. These calculations were carried out for a magnet arrangement having an actively shielded superconducting magnet coil system M without additional superconducting current paths, wherein the radius of the active shielding is twice the outer radius of the main coil of the magnet system M. The dipole moments of main coil and shielding coil are equal in value and opposite in sign. The correction terms in accordance with the method of the present invention, weighted with α=0.33, lead to a deviation of approximately 40 percent for the effective field strength per ampere at large radii for the partial coil of the shim device in comparison to a conventional method. The variable α=0.33 roughly corresponds to the superconductor content of the coil volume of the magnet coil system.

The following terms are introduced to facilitate subsequent discussion:

An actively shielded superconducting magnet coil system M comprises a radially inner coil system C1, in the following referred to as the main coil and a radially outer coil system C2, in the following referred to as the shielding coil. These coils are disposed axially symmetrical about a z axis and generate, in a volume disposed on the axis about z=0, —referred to below as the working volume of the magnet—magnetic fields of opposing directions. An unshielded superconducting magnet coil system M is considered as a special case having a negligible outer coil system C2.

A disturbance field is either an electromagnetic disturbance which is generated outside of the magnet arrangement or a field which is produced by additional coils which do not belong to the magnet coil system M (e.g. by coils of a shim device) and whose field contribution does not exceed 0.1 T.

To obtain formulas which are as compact and clear as possible, the following indices are used in the embodiment:
1 Main coil
2 Shielding coil
M Magnet coil system C1, C2
S Shim device
D Disturbance
P Additional superconducting current path
cl Variable calculated according to prior art
cor Correction terms in accordance with the present invention The indices P1, P2, . . . are used for additional superconducting current paths.

When calculating the effective field strength $g^{\textit{eff}}$ per ampere current of a shim device, the field contributions of the shim coils themselves and also the field changes due to currents which are induced in the superconducting magnet coil system and in further superconductingly closed current paths during charging of the shim device, must be taken into consideration. To calculate the inductive reaction of the magnet coil system with a conventional model (referred to below as the classical model), the superconductor of the magnet coil system is modeled as material without electric resistance. The model on which the present invention is based, takes into consideration additional magnetic properties of the superconductor. All superconducting magnet coil systems have these properties, but they produce the largest effects in actively shielded magnet coil systems with regard to the effective field strength of additional coil systems (e.g. shim devices) in the magnet arrangement, in particular, if the additional coil systems comprise partial coils which are distributed at different radii. In such magnet arrangements, the measured effective field strength of the additional coil system (e.g. of a shim device) frequently fails to correspond to the classically calculated model. As a result, in particular, shim devices dimensioned using a method according to the classical model have an undesired field contribution in the working volume.

Since the field of the superconducting magnet coil system in the working volume is orders of magnitude larger than the field of additional coil systems (e.g. of a shim device), only the component which is parallel to the field of the magnet coil system (herein referred to as z component) of the field of the additional coil systems has an effect on the total field magnitude. For this reason, only $B_z$ fields are observed below.

As soon as a disturbance coil D generates a disturbance field at the location of a superconducting magnet coil system M (e.g. during charging of a shim device), a current is induced in the superconductingly short-circuited magnet coil system in accordance with Lenz's Law, which produces a compensation field in opposition to the disturbance field. The field change $\Delta B_{z,total}$ which results in the working volume is a superposition of the disturbance field $\Delta B_{z,D}$ and of the compensation field $\Delta B_{z,M}$, i.e. $\Delta B_{z,total} = \Delta B_{z,D} + \Delta B_{z,M}$. A current $\Delta I_D$ in the disturbance coil D induces the current $$\Delta I_M^{cl} = -\Delta I_D \cdot \frac{L_{M \leftarrow D}^{cl}}{L_M^{cl}}$$

in the magnetic coil system, wherein $L_M^{cl}$ is the (classical) self-inductance of the magnet coil system and $L_{M \leftarrow D}^{cl}$ is the (classical) inductive coupling between magnet coil system and disturbance coil. The effective field strength in the working volume per ampere current in the disturbance coil D $$g_D^{eff,cl} = \frac{\Delta B_{z,total}}{\Delta I_D}$$

is the superposition of the field contribution per ampere $$g_D = \frac{\Delta B_{z,D}}{\Delta I_D}$$

of the current coil itself plus the field change due to the current induced in the superconducting magnet coil system M per ampere disturbance current, i.e.:

$$g_D^{eff,cl} = g_D + g_M \frac{\Delta I_M^{cl}}{\Delta I_D} = g_D - g_M \frac{L_{M \leftarrow D}^{cl}}{L_M^{cl}}, \quad (1)$$

wherein $g_M$ is the field per ampere of the magnet coil system M in the working volume.

If further superconductingly short-circuited current paths P1, . . . , Pn are present in the magnet arrangement in addition to the magnet coil system M and the disturbance coil D (e.g. of a shim device), the above formula is generalized to:

$$g_D^{eff,cl} = g_D - g^T \cdot (L^{cl})^{-1} \cdot L_{\leftarrow D}^{cl} \quad (2)$$

wherein:

$g^T = (g_M, g_{P1}, \ldots, g_{Pj}, \ldots, g_{Pn})$, wherein:

$g_M$: Field per ampere of the magnet coil system M in the working volume without the field contributions of the currents induced in the additional current paths P1, . . . , Pn, $g_{Pj}$: Field per ampere of the current path Pj in the working volume without the field contributions of the currents induced in the other additional current paths P1, . . . , Pn and in the magnet coil system M, $$L^{cl} = \begin{pmatrix} L_M^{cl} & L_{M \leftarrow P1}^{cl} & \cdots & L_{M \leftarrow Pn}^{cl} \\ L_{P1 \leftarrow M}^{cl} & L_{P1}^{cl} & \cdots & L_{P1 \leftarrow Pn}^{cl} \\ \vdots & \vdots & \ddots & \vdots \\ L_{Pn \leftarrow M}^{cl} & L_{Pn \leftarrow P1}^{cl} & \cdots & L_{Pn}^{cl} \end{pmatrix}$$

Matrix of the (classical) inductive couplings between the magnet coil system M and the current paths P1, . . . , Pn and among the current paths P1, . . . , Pn, $(L^{cl})^{-1}$ Inverse of the matrix $L^{cl}$, $$L_{\leftarrow D}^{cl} = \begin{pmatrix} L_{M \leftarrow D}^{cl} \\ L_{P1 \leftarrow D}^{cl} \\ M \\ L_{Pn \leftarrow D}^{cl} \end{pmatrix}, \text{wherein:}$$

$L_{Pj \leftarrow D}^{cl}$ (classical) inductive coupling of the current path Pj with the coil D, $L_{M \leftarrow D}^{cl}$ (classical) inductive coupling of the magnet coil system M with the coil D.

To calculate the field efficiency $g_S^{eff,cl}$ of a superconducting shim device S, the above derived formula for $g_S^{eff,cl}$ of any disturbance coil D can be used, wherein the couplings of the shim device S to the magnet coil system M and to the additional superconducting current paths P1, . . . , Pn replace the couplings to the disturbance coil D.

The classical inductive couplings and self-inductances are supplemented by an additional contribution by taking into consideration the above-mentioned special magnetic properties of the superconductor. For this reason, the currents which are induced in the magnet coil system M and in the additional current paths P1, . . . , Pn will generally assume different values than those classically calculated. These corrections will be calculated below on the basis of a model of the magnetic behavior of the superconductor in the magnet coil system.

It is known that type I superconductors completely expel the magnetic flux from their inside (Meissner effect). This does not apply for type II superconductors above the lower critical field $H_{c1}$. According to the Bean model (C. P. Bean, Phys. Rev. Lett. 8, 250 (1962), C. P. Bean, Rev. Mod. Phys. 36, 31 (1964)), the magnetic flux lines adhere to the so-called "pinning centers". Small flux changes are trapped by the "pinning centers" at the surface of the superconductor and do not reach the inside of the superconductor to cause a partial expulsion of disturbance fields from the superconductor volume. A type II superconductor reacts diamagnetically to small field fluctuations, whereas larger field changes substantially enter the superconductor material.

To calculate this effect of expulsion of small disturbance fields from the superconductor volume, we make various assumptions. First, we assume that the major portion of the entire superconductor volume of the magnet arrangement is concentrated in the main coil and that the superconductor volume in the shielding coil and in further superconducting coil systems can be neglected.

We further assume that all field fluctuations in the volume of the main coil are reduced with respect to the value which they would have had without the diamagnetic shielding effect of the superconductor, by a constant factor $(1-\alpha)$, with $0 < \alpha < 1$. We assume that there is no reduction of the disturbance fields in the free inner bore of the main coil (radius $Ri_1$) due to the superconductor diamagnetism. The field lines expelled from the main coil accumulate outside of the outer radius $Ra_1$ of the main coil to produce an excess disturbance field in this region. We assume that the strength of this excess disturbance field outside of $Ra_1$ decreases from a maximum value at $Ra_1$ with increasing distance r from the magnet axis as $(1/r^3)$ (dipole behavior). The maximum value at $Ra_1$ is normalized such that the increase in the disturbance flux outside of $Ra_1$ exactly compensates for the reduction of the disturbance flux within the superconductor volume of the main coil (conservation of flux).

The redistribution of magnetic flux caused by the diamagnetic behavior of the superconductor volume in response to small field fluctuations, changes the inductive couplings and self-inductances of coils in the region of the superconducting volume. To extend the classical model of calculating the effective field strength of a disturbance coil D (e.g. of a partial coil of a shim device) by taking the influence of the superconductor diamagnetism into consideration, it is sufficient to determine the right correction term for each coupling or self-inductance term of the formula $g_D^{eff,cl} = g_D - g^T \cdot (L^{cl})^{-1} \cdot L_{\leftarrow D}{}^{cl}$. The correction terms are derived below for all couplings and self-inductances.

The principle of calculating the correction terms is the same in all cases, i.e. determination of the reduction of the magnetic flux through a coil due to a small current change in another coil (or in the same) through the presence of the diamagnetically reacting superconductor material in the main coil of the magnet coil system. The coupling between the first and second coils (or the self-inductance) is correspondingly reduced. The magnitude of the correction term depends on the portion of the volume filled with superconductor material of the main coil within the inductively reacting coil with respect to the entire volume enclosed by the coil. The relative position between the coils also influences the correction term for their mutual inductive coupling.

The use of "reduced coils" has proven to be useful for calculating the correction terms. The coil X reduced to the radius R is that hypothetical coil which would be produced if all windings of the coil X were located at the radius R. The index "X,red,R" is used for this coil. When the flux through a coil changes, the reduced coils permit calculation of the contributions of the flux change through partial areas of this coil with respect to the entire flux change.

First, the correction term for the coupling of a disturbance coil D with the main coil C1 of the magnet coil system (shielded or unshielded) is calculated.

The disturbance field $\Delta B_{z,D}$ in the volume of the main coil C1 is reduced, on the average, by an amount $\alpha \cdot \Delta B_{z,D}$, wherein $0 < \alpha < 1$ is a still unknown parameter. Consequently, the disturbance flux through the main coil C1 and thereby the inductive coupling $L_{1 \leftarrow D}$ of main coil and disturbance source is attenuated by a factor $(1-\alpha)$ with respect to the classical value $L_{1 \leftarrow D}{}^{cl}$ if the disturbance field in the inner bore of the main coil is treated as being reduced by the factor $(1-\alpha)$. We assume that the flux of the disturbance is not expelled from the inner bore of the magnet. For this reason, the coupling between disturbance and main coil must be supplemented by the erroneously subtracted portion from the inner bore. In accordance with the definition of "reduced coils", this amount is $\alpha \cdot L_{(1,red,Ri1) \leftarrow D}{}^{cl}$, wherein $L_{(1,red,Ri1) \leftarrow D}{}^{cl}$ is the coupling of the disturbance with the main coil C1 reduced to its inner radius $Ri_1$. The inductive coupling $L_{1 \leftarrow D}$ between main coil and disturbance source is:

$$L_{1 \leftarrow D} = (1-\alpha) \cdot L_{1 \leftarrow D}{}^{cl} + \alpha L_{(1,red,Ri1) \leftarrow D}{}^{cl} \quad (3)$$

thereby taking into consideration the disturbance field expulsion from the superconductor volume of the main coil.

The expelled flux reappears radially outside of the outer radius $Ra_1$ of the main coil. Assuming that the expelled field has a dipole behavior (decrease with $(1/r^3)$), one obtains, in addition to the classical disturbance field, a contribution outside of the main coil of:

$$\alpha \frac{Ra_1}{r^3} \int_{Ri_1}^{Ra_1} \Delta B_{z,D} R dR. \quad (4)$$

This function is normalized such that the entire flux of the disturbance through a large loop of radius R goes to zero as $R \to \infty$. The disturbance field $\Delta B_{z,D}$ was assumed to be cylindrically symmetrical.

In an actively shielded magnet coil system, the disturbance flux through the shielding coil C2 is also reduced due to expulsion of the disturbance flux by the main coil C1. More precisely, the disturbance flux through a winding at a radius $R_2$ and an axial height $z_0$ is reduced with respect to the classical case by the following amount (integral of (4) over the region $r > R_2$):

$$2\pi\alpha \int_{R_2}^{\infty} \frac{Ra_1}{r^2} dr \int_{Ri_1}^{Ra_1} \Delta B_z^D R dR = 2\pi\alpha \frac{Ra_1}{R_2} \int_{Ri_1}^{Ra_1} \Delta B_z^D R dR$$

$$= \alpha \frac{Ra_1}{R_2} \left( \Phi_{(2,red,Ra_1) \leftarrow D}^{cl} - \Phi_{(2,red,Ri_1) \leftarrow D}^{cl} \right)$$

$\Phi_{(2,red,Ra_1) \leftarrow D}{}^{cl}$ designates the classical disturbance flux through a loop of radius $Ra_1$, which is at the same axial height $z_0$ as the observed loop of radius $R_2$ (analog for $Ri_1$). Summing across all windings of the shielding coil (which are all approximately at the same radius $R_2$) produces the following mutual coupling between disturbance coil and shielding coil:

$$L_{2 \leftarrow D} = L_{2 \leftarrow D}^{cl} - \alpha \frac{Ra_1}{R_2} \left( L_{(2,red,Ra_1) \leftarrow D}^{cl} - L_{(2,red,Ri_1) \leftarrow D}^{cl} \right)$$

$L_{(2,red,Ra_1) \leftarrow D}{}^{cl}$ thereby characterizes the classical coupling of the disturbance coil with the shielding "reduced" to the radius $Ra_1$ (analog for $Ri_1$). This "reduction" together with the multiplicative factor $Ra_1/R_2$ causes the coupling $L_{2 \leftarrow D}$ to be much less attenuated with respect to the classical value $L_{2 \leftarrow D}{}^{cl}$ than is $L_{1 \leftarrow D}$ with respect to $L_{1 \leftarrow D}{}^{cl}$. Since the main and shielding coils are electrically connected in series, the inductive reaction of the shielding coil exceeds that of the main coil in the total reaction of the magnet coil system to the disturbance.

In total, the new coupling of the disturbance D with the magnet coil system M is given by $$L_{M \leftarrow D} = L_{M \leftarrow D}^{cl} - \alpha L_{M \leftarrow D}^{cor} \quad (5)$$

with $$L_{M \leftarrow D}^{cor} = L_{1 \leftarrow D}^{cl} - L_{(1,red,Ri1) \leftarrow D}^{cl} + \frac{Ra_1}{R_2} \left( L_{(2,red,Ra_1) \leftarrow D}^{cl} - L_{(2,red,Ri_1) \leftarrow D}^{cl} \right)$$

Analogous to the main coil, the disturbance flux is also expelled from the superconductor volume of the shielding. Since this volume is typically small compared to the superconductor volume of the main coil, this effect can be neglected.

Whether the disturbance field is generated by a disturbance coil within or outside of the magnet arrangement or by a small current change in the magnet coil system itself, is unimportant for the mechanism of flux expulsion. For this reason, the self-inductance of the magnet coil system also changes compared to the classical case. In particular:

$$L_{1\leftarrow 1}=(1-\alpha)L_{1\leftarrow 1}{}^{cl}+\alpha L_{(1,red,Ri_1)\leftarrow 1}{}^{cl}$$

$$L_{1\leftarrow 2}=(1-\alpha)L_{1\leftarrow 2}{}^{cl}+\alpha L_{(1,red,Ri_1)\leftarrow 2}{}^{cl}$$

The other inductances change as follows:

$$L_{2\leftarrow 2} = L_{2\leftarrow 2}^{cl} - \alpha \frac{Ra_1}{R_2}\left(L_{(2,red,Ra_1)\leftarrow 2}^{cl} - L_{(2,red,Ri_1)\leftarrow 2}^{cl}\right)$$

$$L_{2\leftarrow 1} = L_{2\leftarrow 1}^{cl} - \alpha \frac{Ra_1}{R_2}\left(L_{(2,red,Ra_1)\leftarrow 1}^{cl} - L_{(2,red,Ri_1)\leftarrow 1}^{cl}\right)$$

The new inductance of the magnet coil system is:

$$L_M = L_M^{cl} - \alpha L_M^{cor} \tag{6}$$

with $$L_M^{cor} = L_{1\leftarrow 1}^{cl} - L_{(1,red,Ri_1)\leftarrow 1}^{cl} + L_{1\leftarrow 2}^{cl} - L_{(1,red,Ri_1)\leftarrow 2}^{cl} +$$
$$\frac{Ra_1}{R_2}\left(L_{(2,red,Ra_1)\leftarrow 2}^{cl} - L_{(2,red,Ri_1)\leftarrow 2}^{cl} + L_{(2,red,Ra_1)\leftarrow 1}^{cl} - L_{(2,red,Ri_1)\leftarrow 1}^{cl}\right)$$

Insertion of the corrected coupling $L_{M\leftarrow D}$ between the magnet and disturbance coil in accordance with equation (5) for the effective field efficiency of the disturbance source D, instead of the classical inductive coupling $L_{M\leftarrow D}{}^{cl}$, and the corrected self-inductance $L_M$ in accordance with equation (6) instead of the classical self-inductance $L_M{}^{cl}$ leads to:

$$g_D^{eff} = g_D - g_M \cdot \frac{L_{M\leftarrow D}^{cl} - \alpha L_{M\leftarrow D}^{cor}}{L_M^{cl} - \alpha L_M^{cor}} \tag{7}$$

The above formulas are generalized below for the case of further additional current paths P1, . . . , Pn.

For the direction M←Pj (current change in Pj induces a current in M), the couplings between the magnet coil system and the additional current paths (j=1, . . . , n) are reduced to the same extent as the corresponding couplings between the magnet coil system and a disturbance coil:

$$L_{M\leftarrow Pj}=L_{M\leftarrow Pj}{}^{cl}-\alpha L_{M\leftarrow Pj}{}^{cor} \tag{8}$$

wherein $$L_{M\leftarrow Pj}^{cor} = L_{1\leftarrow Pj}^{cl} - L_{(1,red,Ri_1)\leftarrow Pj}^{cl} + \frac{Ra_1}{R_2}\left(L_{(2,red,Ra_1)\leftarrow Pj}^{cl} - L_{(2,red,Ri_1)\leftarrow Pj}^{cl}\right)$$

The new coupling $L_{Pj\leftarrow M}$ (a current change in M induces a current in Pj) is calculated as follows:

$$L_{Pj\leftarrow M}=L_{Pj\leftarrow M}{}^{cl}-\alpha L_{Pj\leftarrow M}{}^{cor} \tag{9}$$

with $$L_{Pj\leftarrow M}{}^{cor}=f_{Pj}(L_{(Pj,red,Ra_1)\leftarrow M}{}^{cl}-L_{(Pj,red,Ri_1)\leftarrow M}{}^{cl})$$

For $R_{Pj}$>$Ra_1$ the coil Pj "reduced" to $Ra_1$ is again defined such that all windings are shrunk to the smaller radius $Ra_1$ (analog for $Ri_1$). If, however, $Ri_1$<$R_{Pj}$<$Ra_1$, the coil "reduced" to $Ra_1$ is identified with the coil Pj (the windings are not expanded to $Ra_1$). For $R_{Pj}$<$Ri_1$, the coil "reduced" to $Ri_1$ is also identified with the coil Pj, i.e. in this case, there is no correction to the classical theory.

For $R_{Pj}$>$Ra_1$ the constant $f_{Pj}$ is calculated by integration of (4) over the range r>$R_{Pj}$. For $R_{Pj}$≦$Ra_1$, $f_{Pj}$=1:

$$f_{Pj} = \begin{cases} \dfrac{Ra_1}{R_{Pj}}, & R_{Pj} > Ra_1 \\ 1, & R_{Pj} < Ra_1 \end{cases}$$

The corrections due to the properties of the superconductor therefore produce asymmetrical inductance matrices ($L_{M\leftarrow Pj}\neq L_{Pj\leftarrow M}$!).

The coupling $L_{Pj\leftarrow D}$ between an additional superconducting current path Pj and the disturbance coil D is also influenced to a greater or lesser degree by the expulsion of the flux of the disturbance field of the coil D from the superconductor material of the main coil:

$$L_{Pj\leftarrow D}=L_{Pj\leftarrow D}{}^{cl}-\alpha L_{Pj\leftarrow D}{}^{cor} \tag{10}$$

with $$L_{Pj\leftarrow D}{}^{cor}=f_{Pj}(L_{(Pj,red,Ra_1)\leftarrow D}{}^{cl}-L_{(Pj,red,Ri_1)\leftarrow D}{}^{cl})$$

The couplings among the additional superconducting current paths are also reduced to a greater or lesser degree according to the same principle (note the order of the indices):

$$L_{Pj\leftarrow Pk}=L_{Pj\leftarrow Pk}{}^{cl}-\alpha L_{Pj\leftarrow Pk}{}^{cor} \tag{11}$$

with $$L_{Pj\leftarrow Pk}{}^{cor}=f_{Pj}(L_{(Pj,red,Ra_1)\leftarrow Pk}{}^{cl}-L_{(Pj,red,Ri_1)\leftarrow Pk}{}^{cl})(j=1,\ldots,n; k=1,\ldots,n).$$

In particular, the self-inductances (j=k) of the additional superconducting current paths are also influenced.

For a disturbance coil D the actual field contribution $g_D{}^{eff}$ per ampere current in the working volume is calculated with equation (2) for the classical field efficiency $g_D{}^{eff,cl}$ of the disturbance coil D, wherein the corrected values for the couplings $L_{M\leftarrow D}$, $L_{M\leftarrow Pj}$, $L_{Pj\leftarrow M}$, $L_{Pj\leftarrow D}$ and $L_{Pj\leftarrow Pk}$ are inserted according to (5), (8), (9), (10) and (11):

$$g_D{}^{eff}=g_D-g^T\cdot(L^{cl}-\alpha L^{cor})^{-1}\cdot(L_{\leftarrow D}{}^{cl}-\alpha L_{\leftarrow D}{}^{cor})$$

wherein:

$g_D{}^{eff}$: Field contribution per ampere current of a disturbance coil D in the working volume at z=0 thereby taking into consideration the field contributions of the disturbance coil itself and the field change due to currents which are induced in the superconducting magnet coil system M and in the further superconductingly closed current paths P1, . . . , Pn during charging of the disturbance coil, −α: average magnetic susceptibility in the volume of the magnet coil system M with respect to field fluctuations which do not exceed a magnitude of 0.1 T, wherein 0<α≦1, $g^T=(g_M, g_{P1}, \ldots, g_{Pj}, \ldots, g_{Pn})$, $g_{Pj}$: Field per ampere of the current path Pj in the working volume without the field contributions of the current paths Pi for i≦j and of the magnet coil system M and without the field contributions of the disturbance coil D, $g_M$: Field per ampere of the magnet coil system M in the working volume without the field contributions of the current paths P1, . . . , Pn and without the field contributions of the disturbance coil D, $g_D$: Field per ampere of the disturbance coil D in the working volume without the field contributions of the current paths P1, . . . , Pn and of the magnet coil system M, $L^{cl}$: Matrix of the inductive couplings between the magnet coil system M and the current paths P1, ..., Pn and among the current paths P1, ..., Pn, $L^{cor}$: Correction for the inductance matrix $L^{cl}$, which would result with complete diamagnetic expulsion of disturbance fields from the volume of the magnet coil system M, $L_{\leftarrow D}{}^{cl}$: Vector of the inductive couplings of the disturbance coil D with the magnet coil system M and the current paths P1, ..., Pn, $L_{\leftarrow D}{}^{cor}$: Correction for the coupling vector $L_{\leftarrow D}{}^{cl}$, which would result with complete diamagnetic expulsion of disturbance fields from the volume of the magnet coil system M.

If a current path Pj comprises partial coils on different radii, the matrix elements in the correction terms $L^{cor}$ and $L_{\leftarrow D}{}^{cor}$, which belong to Pj, must be calculated such that each partial coil is initially treated as an individual current path and the correction terms of all partial coils are subsequently added. This sum is the matrix element of the current path Pj.

To calculate the field efficiency $g_S{}^{eff}$ of a superconducting shim device S, the above derived formula for $g_D{}^{eff}$ can be used wherein the couplings to the shim device S must replace the couplings of the magnet coil system M and of the additional superconducting current paths P1, ..., Pn with the disturbance coil D.

The field efficiency $g_S{}^{eff}$ of a superconducting shim device S should typically be substantially zero. Production of a field in the working volume by a shim device causes problems during shimming and the current in the magnet coil system may have to be readjusted after setting the shim current to ensure that the magnetic field in the working volume has regained the desired value.

In many superconducting magnet arrangements M, S, P1, ..., Pn with a magnet coil system M, a shim device S and additional superconductingly closed current paths P1, ..., Pn, there is no large difference between the classically calculated field efficiency $g_S{}^{eff,cl}$ and the field efficiency $g_S{}^{eff}$ calculated in accordance with the inventive method. An actively shielded magnet coil system with a main coil C1, a shielding coil C2 and a $Z^2$ shim device whose partial coils are distributed on two different radii is a magnet arrangement in which the magnetic shielding behavior of the superconductor material with respect to small field changes has a considerable effect on the field efficiency $g_S{}^{eff}$ of the shim device. The radially inner partial coils of the $Z^2$ shim device mainly produce a field which has a $z^2$ dependence along the magnet axis z. The radially outer partial coils substantially produce a field which is constant along the z axis. This field contribution compensates for a constant field contribution of the radially inner partial coils such that the total field efficiency $g_S{}^{eff}$ of the shim device in the working volume is zero. The radially inner partial coils of the shim device typically lie in the region of the main coil C1 of the actively shielded magnet coil system and the radially outer partial coils lie in the region of the shielding C2. A shim device of such an arrangement has the advantage that it is more compact compared to an arrangement of partial coils on one single radius thereby providing more space for the magnet coil system.

As seen in FIGS. 2 through 4, the partial coils of a shim device exhibit classical behavior as long as they are in the region of the main coil C1 of the actively shielded magnet coil system. However, their effective field efficiency is enhanced by the magnetic shielding behavior of the superconductor material in the magnet coil system if they are located radially further outward. If the $Z^2$ shim device is distributed over two radii, this means that the effective field efficiency of the radially outer partial coils is larger than expected in accordance with the classical model. If such a shim device is dimensioned according to the classical model (i.e. $g_S{}^{eff,cl}=0$), the actual effective field efficiency $g_S{}^{eff}$ will be considerably art different from zero.

In a first approximation, the parameter ox is the superconductor portion of the volume of the main coil C1. The most exact manner of determining the parameter $\alpha$ is based on a disturbance experiment of the magnet coil system M without additional superconducting current paths S, P1, ..., Pn. Disturbance coils having a large radius are particularly suitable. It is recommended to proceed as follows:

1. Experimental determination of the variable $$\beta^{exp} = \frac{g_D^{exp}}{g_D}$$

of the magnet coil system with respect to a disturbance which is substantially homogeneous in the magnet coil system (e.g. with a disturbance coil D of a large radius), wherein $g_D{}^{exp}$: Measured field change in the working volume of the magnet arrangement per ampere current in the disturbance coil D, $g_D$: Field per ampere of the disturbance coil D in the working volume without the field contributions of the magnet coil system M, 2. Determination of the variable $$\beta^{cl} = 1 - g_M \cdot \left( \frac{L^{cl}_{M \leftarrow D}}{L^{cl}_M \cdot g_D} \right)$$

with respect to the same disturbance coil, wherein $g_M$: Field per ampere of the magnet coil system M in the working volume, $L_M{}^{cl}$: Inductance of the magnet coil system M, $L_{M \leftarrow D}{}^{cl}$: Inductive coupling of the disturbance coil D with the magnet coil system M, 3. Determination of the parameter $\alpha$ from equation $$\alpha = \frac{g_D (L^{cl}_M)^2 (\beta^{exp} - \beta^{cl})}{g_D(\beta^{exp} - \beta^{cl}) L^{cl}_M L^{cor}_M - g_M (L^{cl}_{M \leftarrow D} L^{cor}_M - L^{cor}_{M \leftarrow D} L^{cl}_M)}.$$

wherein $L_M{}^{cor}$: Correction for the self inductance $L_M{}^{cl}$ of the magnet coil system M, which would result with complete diamagnetic expulsion of disturbance fields from the volume of the magnet coil system M, $L_{M \leftarrow D}{}^{cor}$: Correction for the inductive coupling $L_{M \leftarrow D}{}^{cl}$ of the disturbance coil D with the magnet coil system M, which would result with complete diamagnetic expulsion of disturbance fields from the volume of the magnet coil system M.

We claim:

1. A superconducting magnet device (M, S, P1, ..., Pn) for generating a magnetic field in a direction of a z axis in a working volume disposed about z=0, and the device comprising:

a magnet coil system (M) with at least one current-carrying superconducting magnet coil;

at least one additional superconductingly closed current path (P1, ..., Pn), wherein magnetic fields generated in the z direction in the working volume by said addition al current paths (P1, . . . , Pn) due to induced currents do not exceed a magnitude of 0.1 Tesla;

a shim device (S) with at least one superconducting shim coil, said shim device (S) generating a field which varies along the z axis with a $k^{th}$ power of z for an even power of k>0, said shim device (S) designed such that a variable $$g_S^{eff} = g_S - g^T \cdot (L^{cl} - \alpha L^{cor})^{-1} \cdot (L_{\leftarrow S}^{cl} - \alpha L_{\leftarrow S}^{cor})$$

is substantially zero and an absolute value of $$g_S^{eff,cl} = g_S - g^T \cdot (L^{cl})^{-1} \cdot L_{\leftarrow S}^{cl}$$

is larger than zero, wherein said variables have following definitions:

- $\alpha$: average magnetic susceptibility in a volume of said magnet coil system (M) with respect to field fluctuations which do not exceed a magnitude of 0.1 T, wherein $0 < \alpha \leq 1$, $g^T = (g_M, g_{P1}, \ldots, g_{Pj}, \ldots, g_{Pn})$, $g_{Pj}$: Field per ampere of said current path Pj in the working volume without field contributions of said current paths Pi for i≠j, of said magnet coil system (M), and of said shim device (S), $g_M$: Field per ampere of said magnet coil system (M) in the working volume without field contributions of said current paths (P1, . . . , Pn) and without field contributions of said shim device (S), $g_S$: Field per ampere of said shim device (S) in the working volume without field contributions of said current paths (P1, . . . , Pn) and without field contributions of said magnet coil system (M), $L^{cl}$: Matrix of inductive couplings between said magnet coil system (M) and said current paths (P1, . . . , Pn) and among said current paths (P1, . . . , Pn), $L^{cor}$: Correction for said inductance matrix $L^{cl}$, which would result with complete diamagnetic expulsion of disturbance fields from said volume of said magnet coil system (M), $L_{\leftarrow S}^{cl}$: Vector of inductive couplings of said shim device (S) with said magnet coil system (M) and said current paths (P1, . . . , Pn), $L_{\leftarrow S}^{cor}$: Correction for said coupling vector $L_{\leftarrow S}^{cl}$, which would result with complete diamagnetic expulsion of disturbance fields from said volume of said magnet coil system (M).

2. The magnet device of claim 1, wherein $g_S^{eff,cl}$ is larger than 0.2 millitesla per ampere current in said shim device (S).

3. The magnet device of claim 1, wherein said magnet device is part of an apparatus for high-resolution magnetic resonance spectroscopy.

4. The magnet device of claim 3, wherein said magnetic resonance apparatus comprises means for field-locking the magnetic field generated in the working volume.

5. The magnet device of claim 1, wherein said magnet device comprises field modulation coils.

6. The magnet device of claim 1, wherein said superconducting magnet coil system (M) comprises a radially inner and a radially outer coaxial coil system (C1, C2) which are electrically connected in series, wherein each of said radially inner and said radially outer systems generates one magnetic field of mutually opposing direction along the z axis in the working volume.

7. The magnet device of claim 6, wherein said radially inner coil system (C1) and said radially outer coil system (C2) have dipole moments approximately equal in value and opposite in sign.

8. The magnet device of claim 1, wherein said magnet coil system (M) forms a first current path which is superconductingly short circuited during operation, wherein at least one of said additional current paths (P1, . . . , Pn), which are superconductingly short-circuited during operation, comprises a disturbance compensation coil which is not galvanically connected to and which is disposed coaxially with said magnet coil system (M).

9. The magnet device of claim 1, wherein at least one of said additional current paths (P1, . . . , Pn) comprises a part of said magnet coil system (M) which is bridged with a superconducting switch.

10. The magnet device of claim 1, wherein at least one of said additional current paths (P1, . . . , Pn) is part of a system for compensating a drift of said magnet coil system (M).

11. The magnet device of claim 1, wherein at least one of said additional current paths (P1, . . . , Pn) comprises an additional superconducting shim device.

12. The magnet device of claim 1, wherein said superconducting shim device (S) generates a field which has a $z^2$ dependence along the z axis in a region of the working volume.

13. The magnet device of claim 1, wherein said superconducting shim device (S) comprises partial coils wound on different radii.

14. The magnet device of claim 1, wherein said superconducting shim device (S) is inductively decoupled from said superconducting magnet coil system (M).

15. The magnet arrangement of claim 6, wherein different polarities of said radially inner and said radially outer coil systems are utilized for inductive decoupling of said shim device (S) from said magnet coil system (M).

16. A method for dimensioning a superconducting shim device (S) in a superconducting magnet device (M, S, P1, . . . , Pn), said magnet device (M, S, P1, . . . , Pn) generating a magnetic field in a direction of a z axis in a working volume disposed about z=0 the device having a magnet coil system (M) with at least one current carrying superconducting magnet coil and at least one additional superconductingly closed current path (P1, . . . , Pn), wherein magnetic fields generated in the z direction in the working volume by said additional current paths (P1, . . . , Pn) due to induced currents do not exceed a magnitude of 0.1 Tesla, wherein said shim device (S) generates a field which varies along the z axis with a $k^{th}$ power of z for an even power of k>0, the method comprising the step of:

calculating a variable $g_S^{eff}$, which corresponds to a field change in the working volume at z=0 per ampere current in said shim device (S) taking into consideration magnetic fields generated by currents induced in a remaining magnet arrangement (M, P1, . . . , Pn) according to:

$$g_S^{eff} = g_S - g^T \cdot (L^{cl} - \alpha L^{cor})^{-1} \cdot (L_{\leftarrow S}^{cl} - \alpha L_{\leftarrow S}^{cor}),$$

wherein:

- $\alpha$: average magnetic susceptibility in a volume of said magnet coil system (M) with respect to field fluctuations which do not exceed a magnitude of 0.1 T, wherein $0 < \alpha \leq 1$, $g^T: (g_M, g_{P1}, \ldots, g_{Pj}, \ldots, g_{Pn})$, $g_{Pj}$: Field per ampere of said current path Pj in the working volume without field contributions of said current paths Pi for i≠j and of said magnet coil system (M) and without field contributions of said shim device (S), $g_M$: Field per ampere of said magnet coil system (M) in the working volume without field contributions of said current paths (P1, . . . , Pn) and without field contributions of said shim device (S), $g_S$: Field per ampere of said shim device (S) in the working volume without field contributions of said current paths (P1, . . . , Pn) and without field contributions of said magnet coil system (M), $L^{cl}$: Matrix of inductive couplings between said magnet coil system (M) and said current paths (P1, . . . , Pn) and among said current paths (P1, . . . , Pn), $L^{cor}$: Correction for said inductance matrix $L_{cl}$, which would result with complete diamagnetic expulsion of disturbance fields from said volume of said magnet coil system (M), $L_{\leftarrow S}{}^{cl}$: Vector of inductive couplings of said shim device (S) with said magnet coil system (M) and said current paths (P1, . . . , Pn), $L_{\leftarrow S}{}^{cor}$: Correction for said coupling vector $L_{\leftarrow S}{}^{cl}$, which would result with complete diamagnetic expulsion of disturbance fields from said volume of said magnet coil system (M).

17. The method of claim 16, wherein α corresponds to a volume portion of superconductor material with respect to a total volume of said magnet coil system (M).

18. The method of claim 16, wherein α is experimentally determined from measurement of a variable $\beta^{exp}$ of said magnet coil system (M), without said current paths (P1, . . . , Pn) and without said shim device (S), in response to a disturbance coil (D) which produces a substantially homogeneous disturbance field in said volume of said magnet coil system (M) and through insertion of said variable $\beta_{exp}$ into an equation $$\alpha = \frac{g_D(L_M^{cl})^2(\beta^{exp} - \beta^{cl})}{g_D(\beta^{exp} - \beta^{cl})L_M^{cl}L_M^{cor} - g_M(L_{M\leftarrow D}^{cl}L_M^{cor} - L_{M\leftarrow D}^{cor}L_M^{cl})},$$

wherein $$\beta^{exp} = \frac{g_D^{exp}}{g_D},$$

$g_D^{exp}$: Measured field change in the working volume of said magnet arrangement per ampere current in said disturbance coil (D), $$\beta^{cl} = 1 - g_M \cdot \left(\frac{L_{M\leftarrow D}^{cl}}{L_M^{cl} \cdot g_D}\right),$$

$g_M$: Field per ampere of said magnet coil system (M) in the working volume, $g_D$: Field per ampere of said disturbance coil (D) in the working volume without the field contributions of said magnet coil system (M), $L_M^{cl}$: Self inductance of said magnet coil system (M), $L_{M\leftarrow D}^{cl}$: Inductive coupling of said disturbance coil (D) with said magnet coil system (M), $L_M^{cor}$: Correction for said self inductance $L_M^{cl}$, which would result with complete diamagnetic expulsion of disturbance fields from said volume of said magnet coil system (M), $L_{M\leftarrow D}^{cor}$: Correction for said inductive coupling $L_{M\leftarrow D}^{cl}$ of said disturbance coil (D) with said magnet coil system (M) which would result with complete diamagnetic expulsion of disturbance fields from said volume of said magnet coil system (M).

19. The method of claim 18, characterized in that the corrections $L^{cor}$, $L_{\leftarrow S}{}^{cor}$, $L_M{}^{cor}$ and $L_{M\leftarrow S}{}^{cor}$ are calculated as follows:

$$L^{cor} = \begin{pmatrix} L_M^{cor} & L_{M\leftarrow P1}^{cor} & \cdots & L_{M\leftarrow Pn}^{cor} \\ L_{P1\leftarrow M}^{cor} & L_{P1}^{cor} & \cdots & L_{P1\leftarrow Pn}^{cor} \\ \vdots & \vdots & \ddots & \vdots \\ L_{Pn\leftarrow M}^{cor} & L_{Pn\leftarrow P1}^{cor} & \cdots & L_{Pn}^{cor} \end{pmatrix},$$

$$L_{\leftarrow S}^{cor} = \begin{pmatrix} L_{M\leftarrow S}^{cor} \\ L_{P1\leftarrow S}^{cor} \\ \vdots \\ L_{Pn\leftarrow S}^{cor} \end{pmatrix},$$

$L_{Pj\leftarrow Pk}^{cor} = f_{Pj}(L_{(Pj,red,Ra_1)\leftarrow Pk}^{cl} - L_{(Pj,red,Ri_1)\leftarrow Pk}^{cl})$, $L_{Pj\leftarrow S}^{cor} = f_{Pj}(L_{(Pj,red,Ra_1)\leftarrow S}^{cl} - L_{(Pj,red,Ri_1)\leftarrow S}^{cl})$, $L_{Pj\leftarrow M}^{cor} = f_{Pj}(L_{(Pj,red,Ra_1)\leftarrow M}^{cl} - L_{(Pj,red,Ri_1)\leftarrow M}^{cl})$, $L_{M\leftarrow Pj}^{cor} = L_{1\leftarrow Pj}^{cl} - L_{(1,red,Ri_1)\leftarrow Pj}^{cl} + \frac{Ra_1}{R_2}(L_{(2,red,Ra_1)\leftarrow Pj}^{cl} - L_{(2,red,Ri_1)\leftarrow Pj}^{cl})$, $L_{M\leftarrow S}^{cor} = L_{1\leftarrow S}^{cl} - L_{(1,red,Ri1)\leftarrow S}^{cl} + \frac{Ra_1}{R_2}(L_{(2,red,Ra_1)\leftarrow S}^{cl} - L_{(2,red,Ri_1)\leftarrow S}^{cl})$, $L_M^{cor} = L_{1\leftarrow 1}^{cl} - L_{(1,red,Ri1)\leftarrow 1}^{cl} + L_{1\leftarrow 2}^{cl} - L_{(1,red,Ri1)\leftarrow 2}^{cl} +$
$\frac{Ra_1}{R_2}(L_{(2,red,Ra_1)\leftarrow 2}^{cl} - L_{(2,red,Ri_1)\leftarrow 2}^{cl} + L_{(2,red,Ra_1)\leftarrow 1}^{cl} - L_{(2,red,Ri_1)\leftarrow 1}^{cl})$ wherein $Ra_1$: one of an outer radius of said magnet coil system (M) and, in case of an actively shielded magnet coil system (M), an outer radius of a main coil (C1), $Ri_1$: an inner radius of said magnet coil system (M), $R_2$: one of an average radius of shielding (C2) of an actively shielded magnet coil system (M) and infinity, $R_{Pj}$: an average radius of said additional coil Pj, $$f_{Pj} = \begin{cases} \frac{Ra_1}{R_{Pj}}, & R_{Pj} > Ra_1 \\ 1, & R_{Pj} < Ra_1 \end{cases}$$

and wherein an index 1 designates one of said main coil (C1) of an actively shielded magnet coil system (M) and otherwise said magnet coil system (M), and an index 2 is one of a shielding (C2) of an actively shielded magnet coil system and omitted otherwise, and an index (X,red,R) designates a hypothetical coil having all windings at of a coil X at a radius R.

* * * * *